(12) United States Patent
Enomoto et al.

(10) Patent No.: US 10,622,185 B2
(45) Date of Patent: Apr. 14, 2020

(54) CHARGED PARTICLE BEAM DEVICE

(71) Applicant: Hitachi High-Technologies Corporation, Minato-ku, Tokyo (JP)

(72) Inventors: Hirohisa Enomoto, Tokyo (JP); Wataru Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/313,693

(22) PCT Filed: Jun. 21, 2017

(86) PCT No.: PCT/JP2017/022863
§ 371 (c)(1),
(2) Date: Dec. 27, 2018

(87) PCT Pub. No.: WO2018/016255
PCT Pub. Date: Jan. 25, 2018

(65) Prior Publication Data
US 2019/0259566 A1 Aug. 22, 2019

(30) Foreign Application Priority Data
Jul. 20, 2016 (JP) ................................ 2016-142136

(51) Int. Cl.
*H01J 37/20* (2006.01)
*H01J 37/16* (2006.01)
(Continued)

(52) U.S. Cl.
CPC .............. *H01J 37/16* (2013.01); *F16F 15/02* (2013.01); *F16F 15/04* (2013.01); *F16F 15/08* (2013.01); *H01J 37/09* (2013.01)

(58) Field of Classification Search
CPC ...... H01J 37/20; H01J 37/16; H01J 2237/061; H01J 37/023; H01J 2237/2007;
(Continued)

(56) References Cited

U.S. PATENT DOCUMENTS 2,423,158 A * 7/1947 Runge ..................... H01J 37/20
250/442.11
2,447,260 A * 8/1948 Marton .................. H01J 37/252
250/305
(Continued)

FOREIGN PATENT DOCUMENTS

CN 102473577 A 5/2012
JP 3741558 B2 2/2006
(Continued)

OTHER PUBLICATIONS

International Search Report (PCT/ISA/210) issued in PCT Application No. PCT/JP2017/022863 dated Sep. 12, 2017 with English translation (three pages).
(Continued)

*Primary Examiner* — David A Vanore
(74) *Attorney, Agent, or Firm* — Crowell & Moring LLP

(57) ABSTRACT

Provided is a charged particle beam device in which a support body is rigid enough to support a sample chamber while the vibration of the support body is reduced even under the action of a disturbance such as environmental sound, the degree of parallelism of the support body is maintained, and increase in weight of the support body is suppressed. The support body includes: a first member which supports a mounted object, and is supported by a vibration removing mount; second members which have a thickness different from that of the first member and arranged to overlap the first member; fixing members which fix the first member and the second members; and damping members which have rigidity lower than the fixing members
(Continued)

and are deformed by a difference in variations between the first member and the second members.

8 Claims, 14 Drawing Sheets

(51) Int. Cl.
| | | |
|---|---|---|
| *F16F 15/04* | (2006.01) | |
| *H01J 37/09* | (2006.01) | |
| *F16F 15/02* | (2006.01) | |
| *F16F 15/08* | (2006.01) | |

(58) Field of Classification Search
CPC ... H01J 2237/20221; H01J 2237/20278; H01J 2237/20292; G03F 7/709; G03F 7/70833; G03F 7/70716; G03F 7/70825
USPC ... 250/442.11, 311, 310, 440.11, 491.1, 400, 250/422.1; 248/550, 638
See application file for complete search history.

(56) References Cited

U.S. PATENT DOCUMENTS

| | | | | |
|---|---|---|---|---|
| 3,772,510 | A * | 11/1973 | Mertens | F16F 15/0275 250/311 |
| 4,314,486 | A * | 2/1982 | Hellwig | F01D 5/10 74/573.1 |
| 4,948,971 | A * | 8/1990 | Vogen | H01J 37/02 250/306 |
| 5,178,357 | A * | 1/1993 | Platus | F16F 3/026 248/619 |
| 5,179,516 | A * | 1/1993 | Choshitani | F16F 15/0275 248/562 |
| 5,370,352 | A * | 12/1994 | Platus | F16F 3/026 248/619 |
| 5,693,990 | A * | 12/1997 | Miyazaki | F16F 15/03 248/550 |
| 5,765,800 | A * | 6/1998 | Watanabe | F16F 15/0232 248/550 |
| 6,036,162 | A * | 3/2000 | Hayashi | G03F 7/709 248/550 |
| 6,038,013 | A * | 3/2000 | Ohsaki | G03F 7/70716 248/550 |
| 6,043,490 | A * | 3/2000 | Sakai | H01J 37/02 250/306 |
| 6,355,994 | B1 * | 3/2002 | Andeen | G03F 7/70716 248/550 |
| 6,403,968 | B1 * | 6/2002 | Hazaki | H01J 37/20 250/442.11 |
| 6,522,388 | B1 * | 2/2003 | Takahashi | F16F 15/02 248/550 |
| 6,774,981 | B1 * | 8/2004 | Watson | G03B 27/42 248/550 |
| 6,794,665 | B2 * | 9/2004 | Kurihara | B82Y 10/00 250/440.11 |
| 6,879,375 | B1 * | 4/2005 | Kayama | G03F 7/70691 248/550 |
| 7,091,497 | B2 * | 8/2006 | Visscher | H01J 37/20 250/440.11 |
| 7,351,970 | B2 * | 4/2008 | Miyao | G01N 23/225 250/310 |
| 7,936,443 | B2 * | 5/2011 | Butler | G03F 7/70833 355/53 |
| 8,263,943 | B2 * | 9/2012 | Shichi | H01J 27/26 250/311 |
| 8,387,945 | B2 * | 3/2013 | Cope | F16K 31/0679 251/129.1 |
| 8,822,952 | B2 * | 9/2014 | Muto | G10K 11/172 250/441.11 |
| 10,056,226 | B2 * | 8/2018 | Takahashi | H01J 37/261 |
| 2003/0189177 | A1 * | 10/2003 | Hazelton | G03F 7/70716 250/442.11 |
| 2005/0205809 | A1 * | 9/2005 | Uchida | B82Y 10/00 250/492.22 |
| 2009/0057566 | A1 * | 3/2009 | Winkler | F25D 19/006 250/423 F |
| 2009/0309043 | A1 * | 12/2009 | Nobuhara | H01J 37/20 250/442.11 |
| 2010/0266961 | A1 * | 10/2010 | Kawamura | G03F 7/70716 430/319 |
| 2011/0147609 | A1 * | 6/2011 | Shichi | H01J 27/26 250/400 |
| 2012/0091362 | A1 * | 4/2012 | Tsuji | F16F 9/306 250/441.11 |
| 2012/0097863 | A1 * | 4/2012 | Saho | H01J 37/08 250/443.1 |
| 2012/0127299 | A1 | 5/2012 | Ohtaki et al. | |
| 2012/0193550 | A1 * | 8/2012 | Tsuji | F16F 1/50 250/396 R |
| 2014/0197331 | A1 * | 7/2014 | Enomoto | H01J 37/16 250/398 |
| 2014/0291514 | A1 * | 10/2014 | Gong | G01N 21/88 250/310 |
| 2015/0083930 | A1 * | 3/2015 | Matsubara | H01J 37/08 250/423 F |
| 2015/0136994 | A1 * | 5/2015 | Van De Peut | H01J 37/045 250/396 R |
| 2016/0005568 | A1 * | 1/2016 | Mizuochi | H01J 37/20 250/442.11 |
| 2018/0299783 | A1 * | 10/2018 | Van Lankvelt | F16F 15/02 |

FOREIGN PATENT DOCUMENTS

| | | |
|---|---|---|
| JP | 2013-103609 A | 5/2013 |
| JP | 2013-126072 A | 6/2013 |

OTHER PUBLICATIONS

Japanese-language Written Opinion (PCT/ISA/237) issued in PCT Application No. PCT/JP2017/022863 dated Sep. 12, 2017 (three pages).

Chinese-language Office Action issued in counterpart Chinese Application No. 201780030731.2 dated Nov. 14, 2019 with partial English translation (eight (8) pages).

* cited by examiner

[FIG. 1]
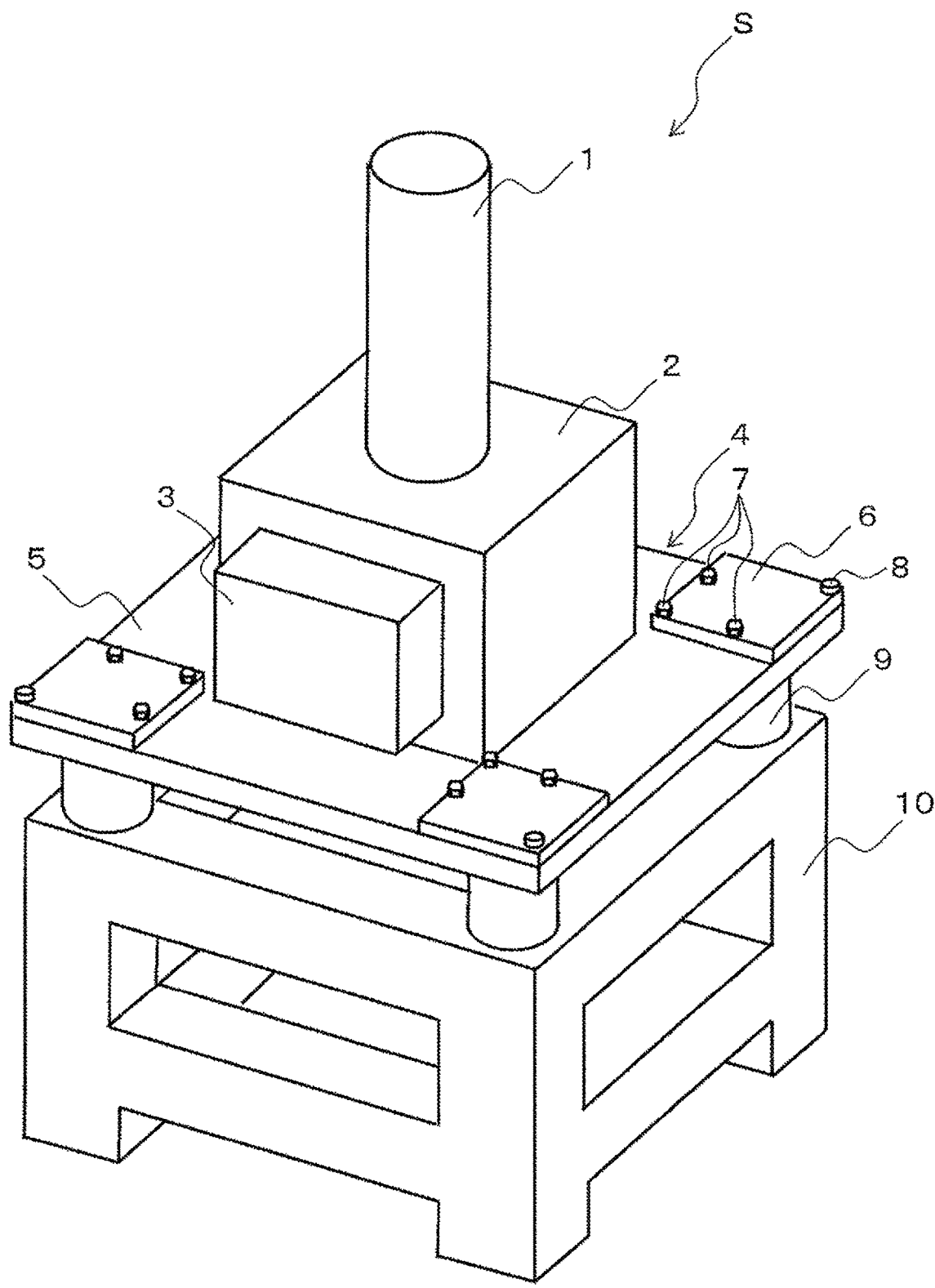

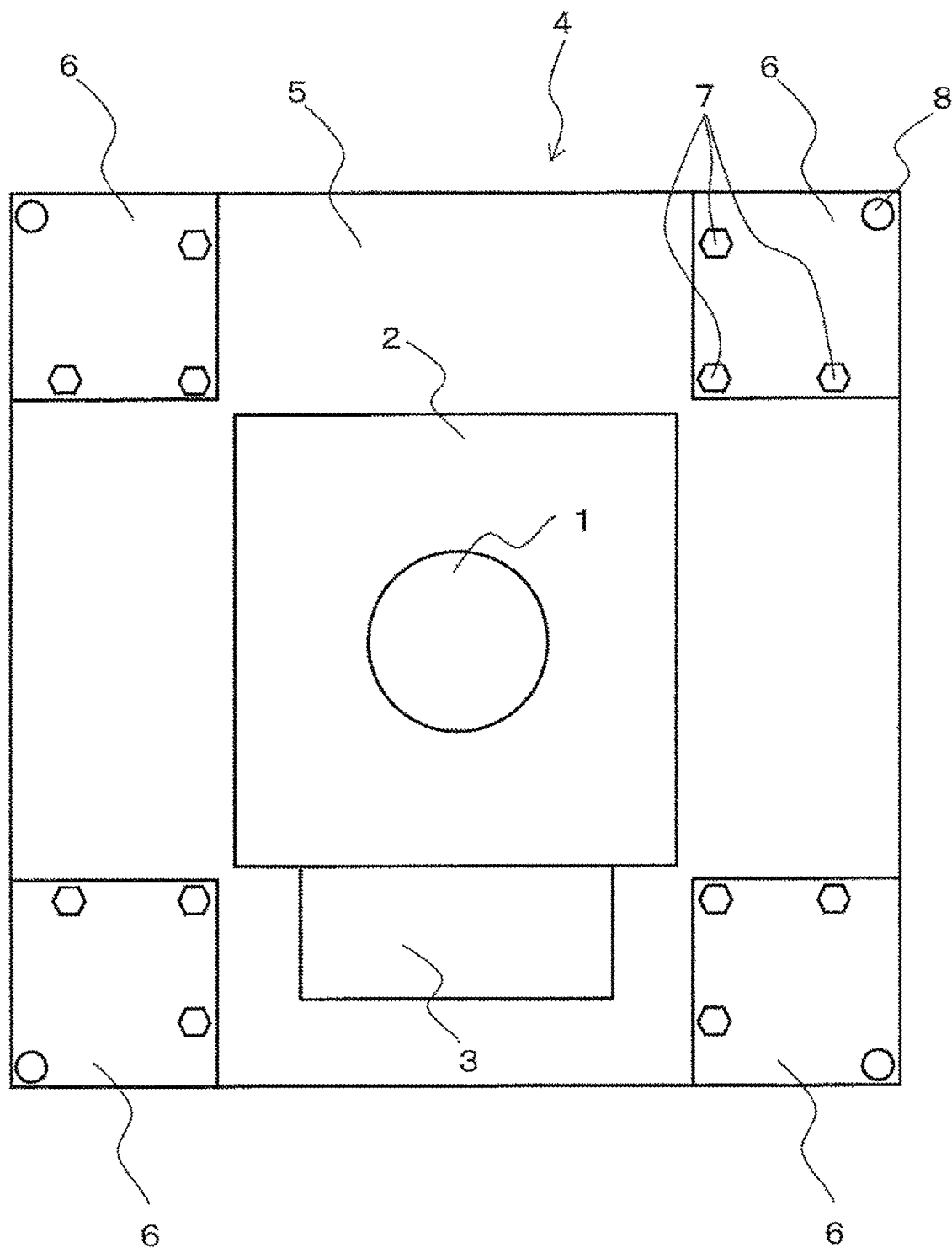
[FIG. 2]

[FIG. 3]
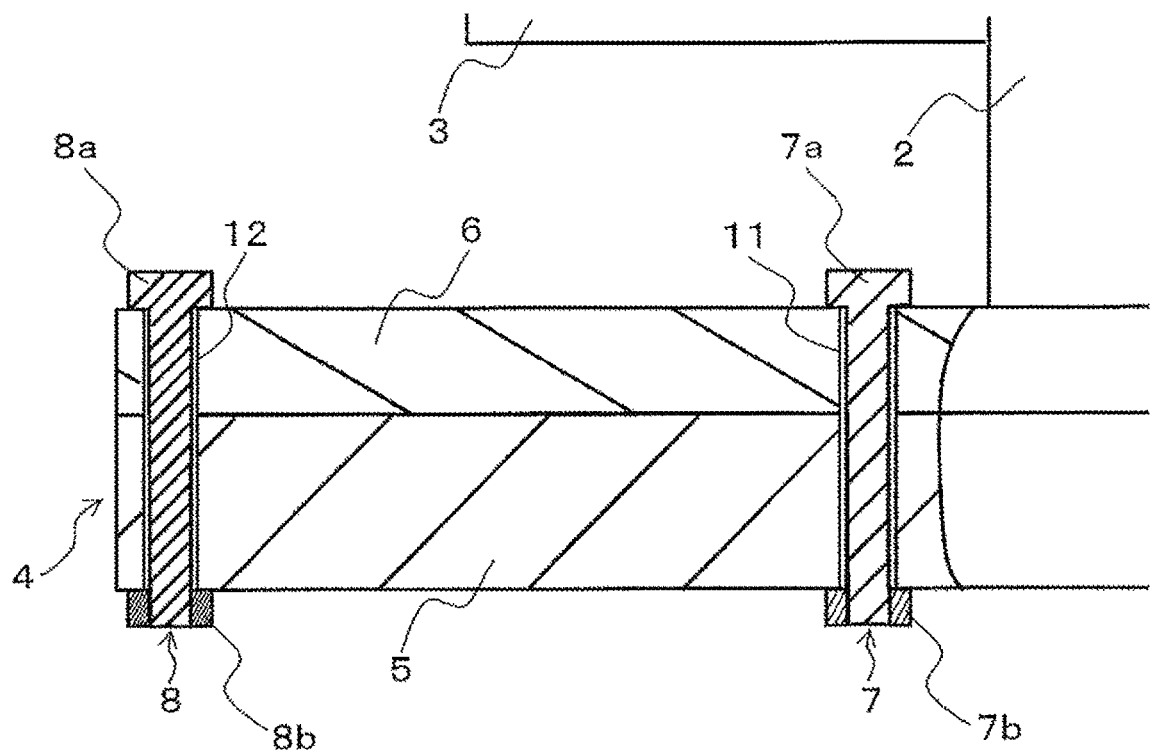

[FIG. 4A]
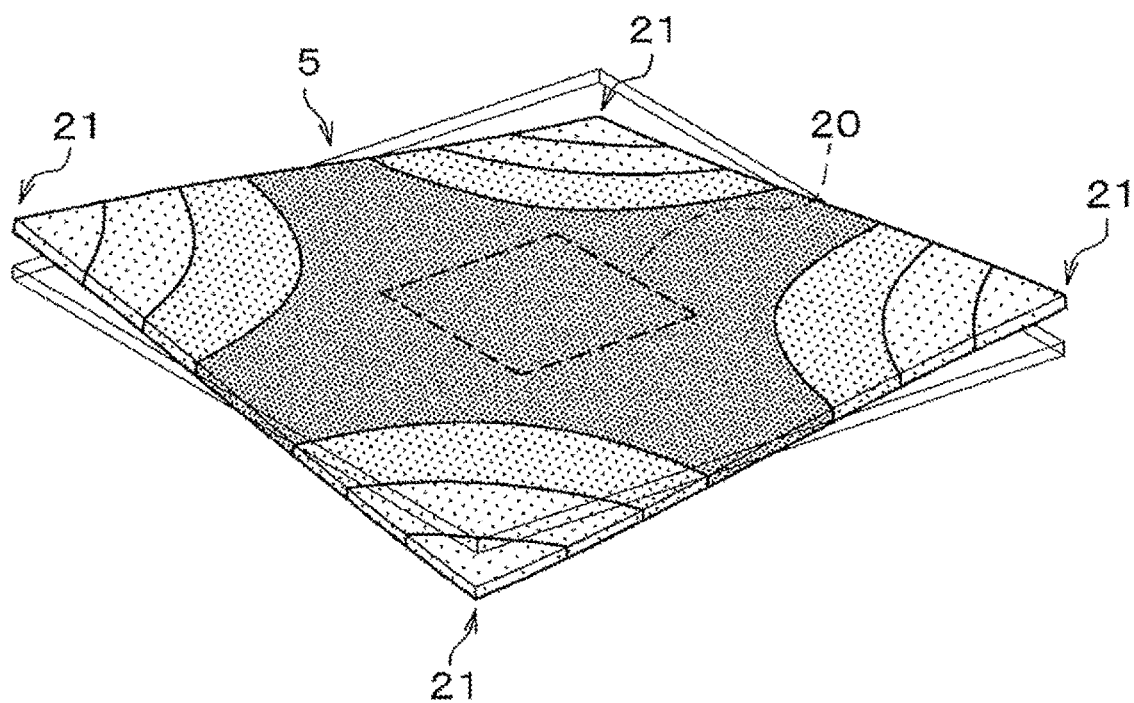
[FIG. 4B]
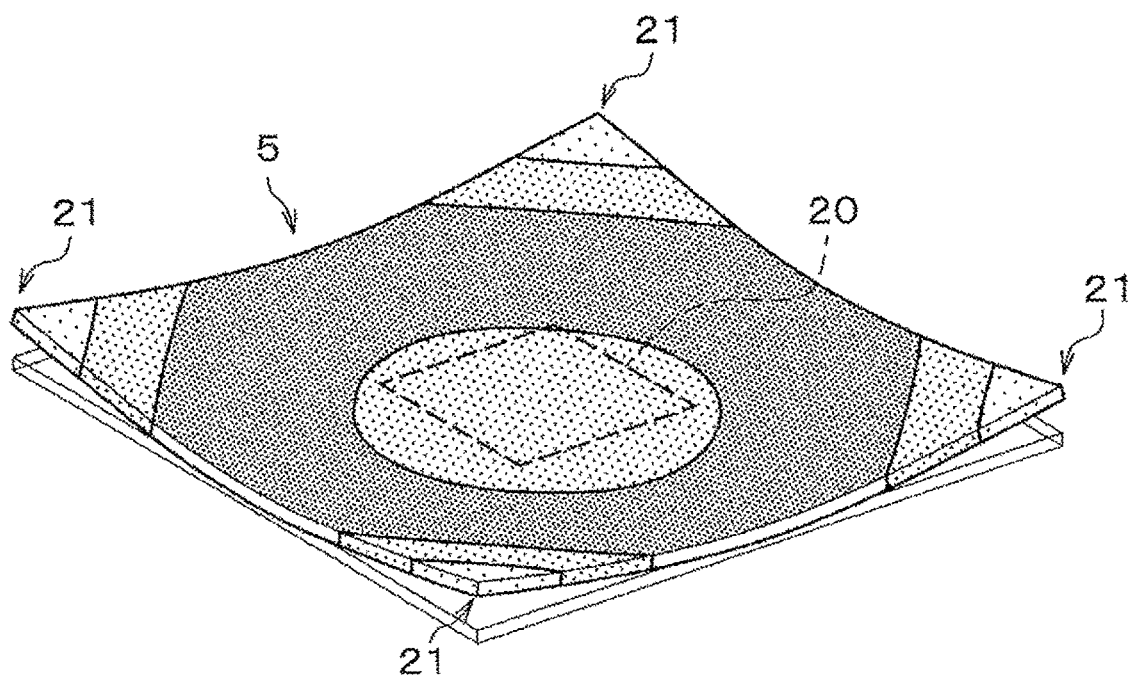

[FIG. 5]
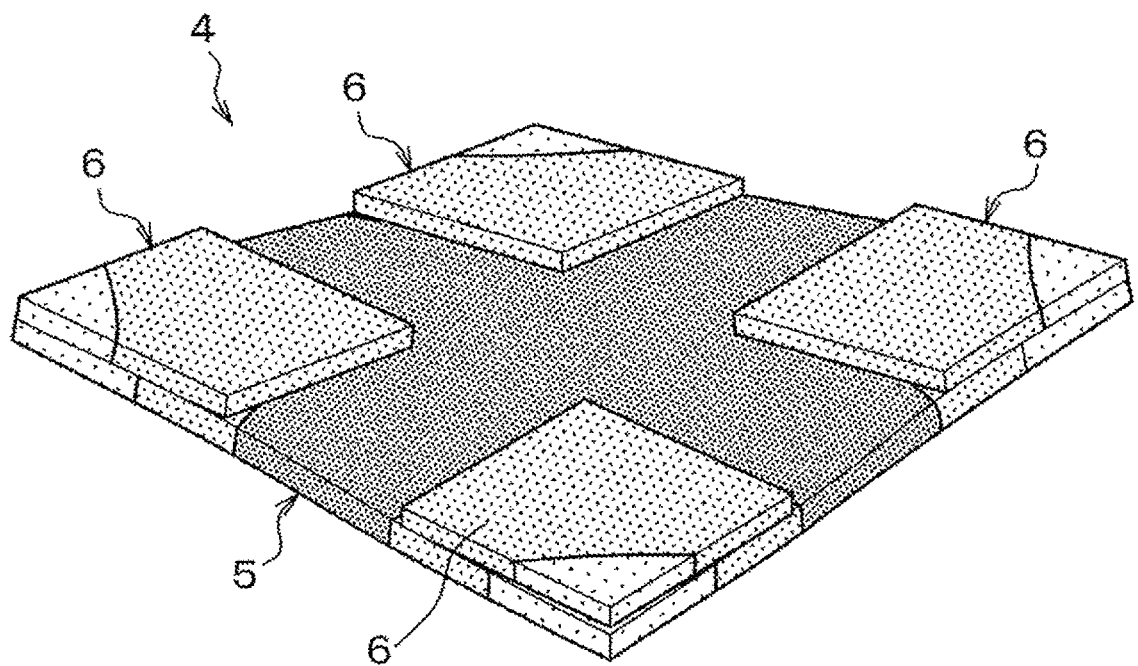

[FIG. 6]
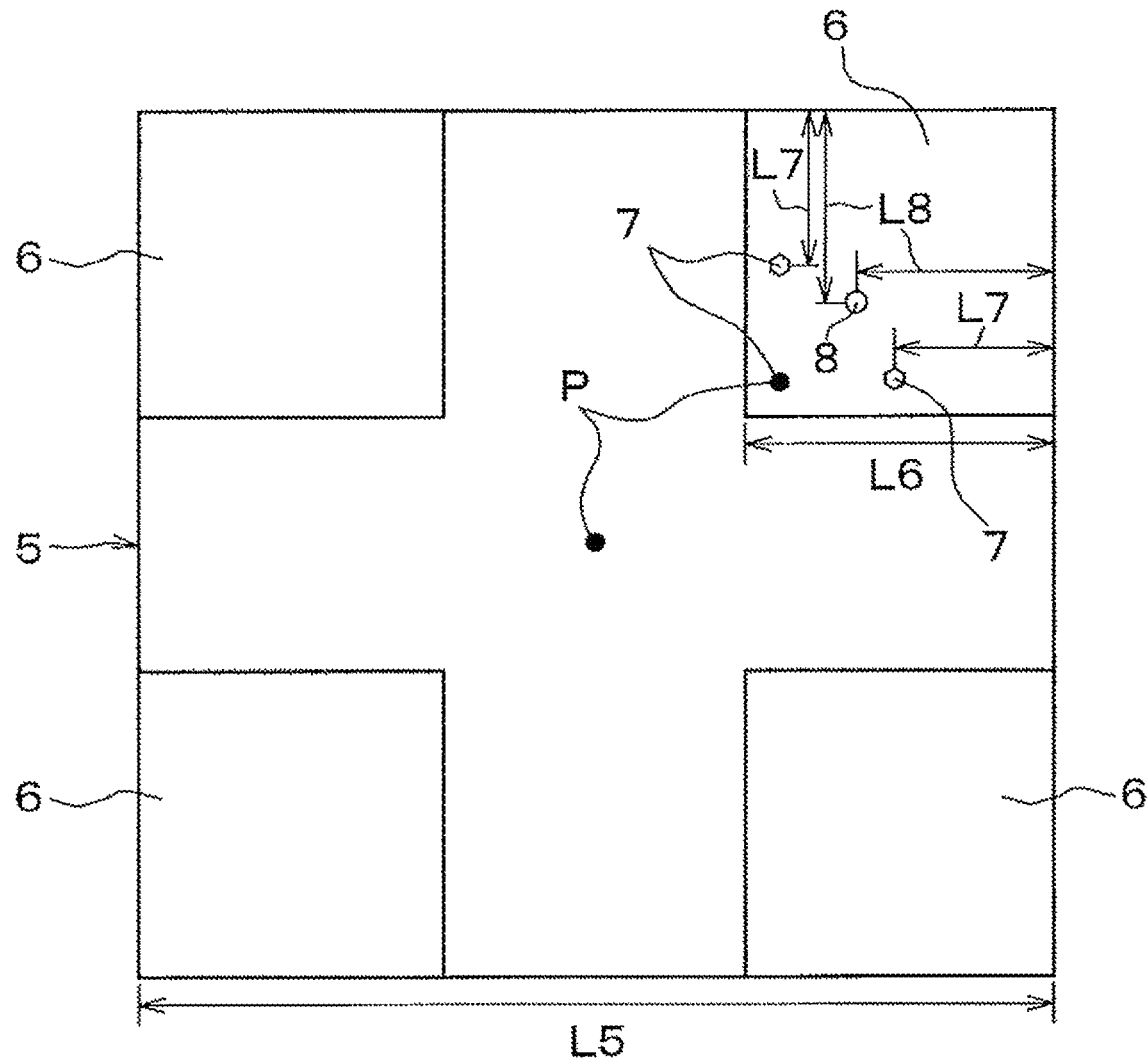

[FIG. 7]
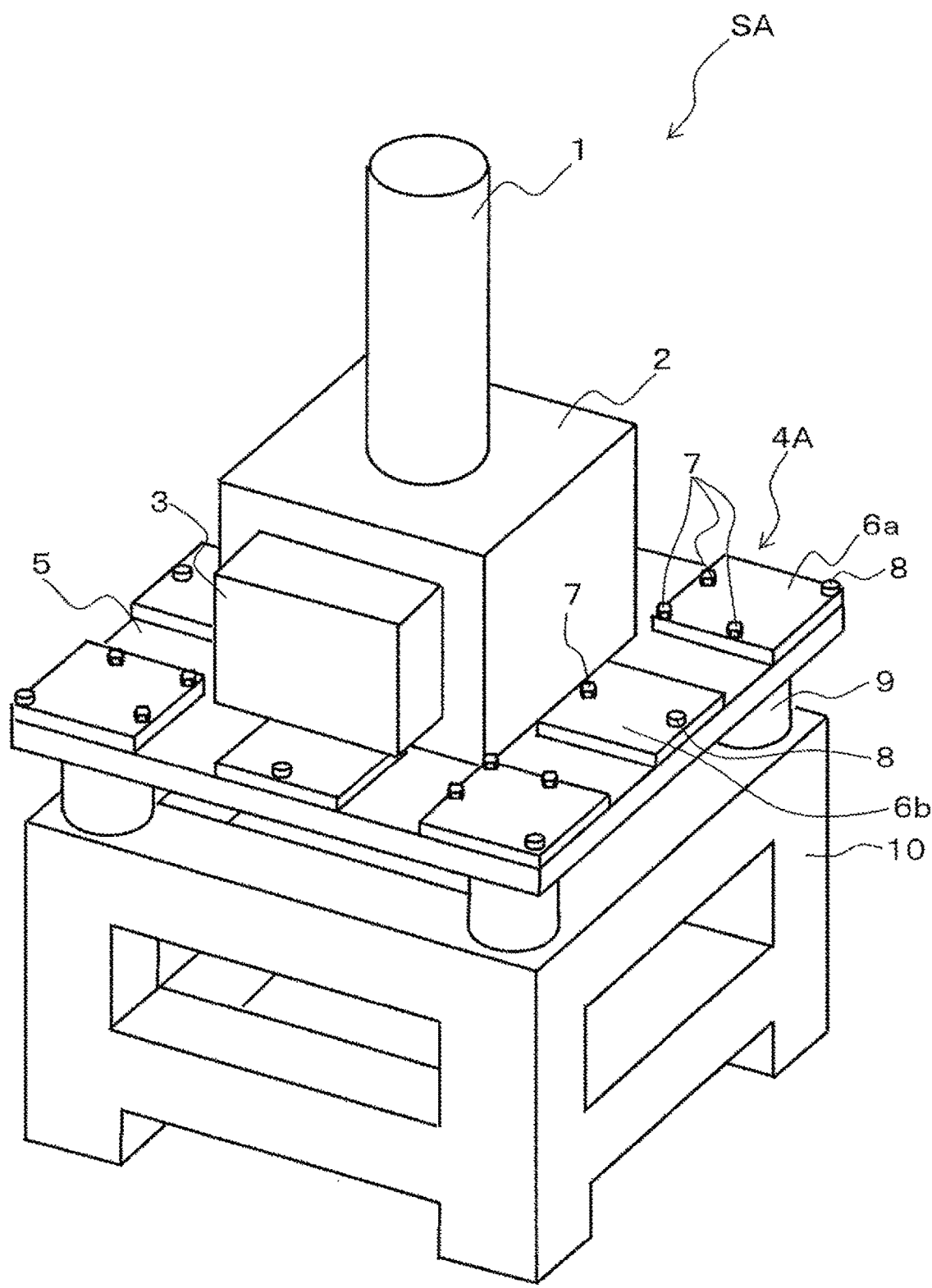

[FIG. 8]
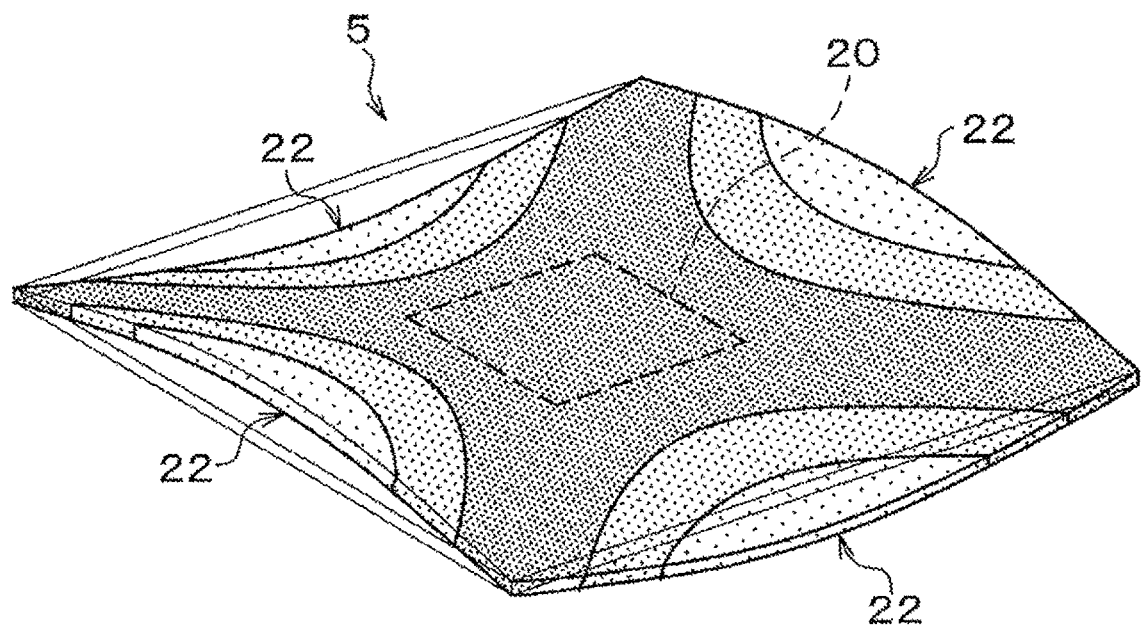

[FIG. 9]
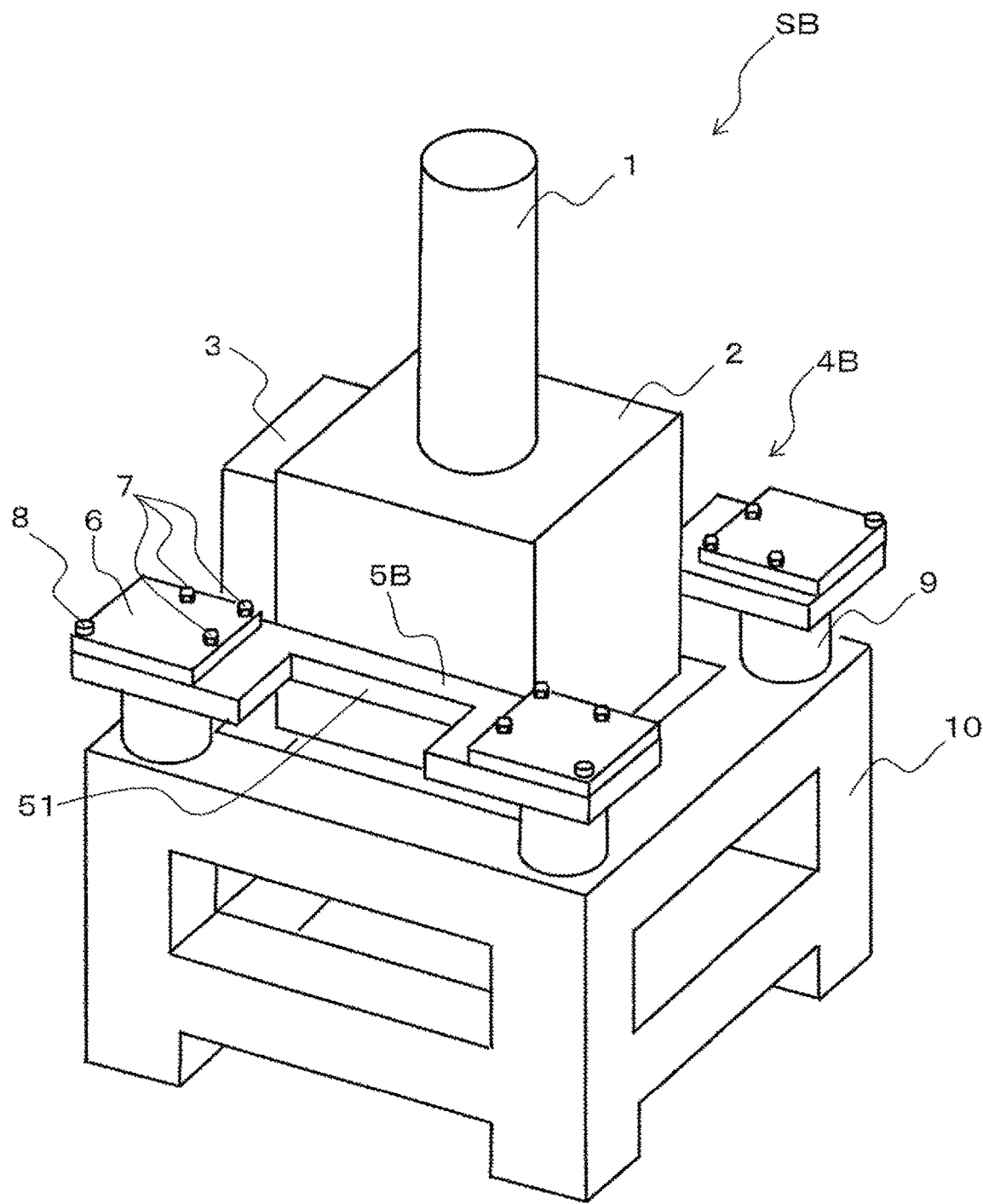

[FIG. 10]
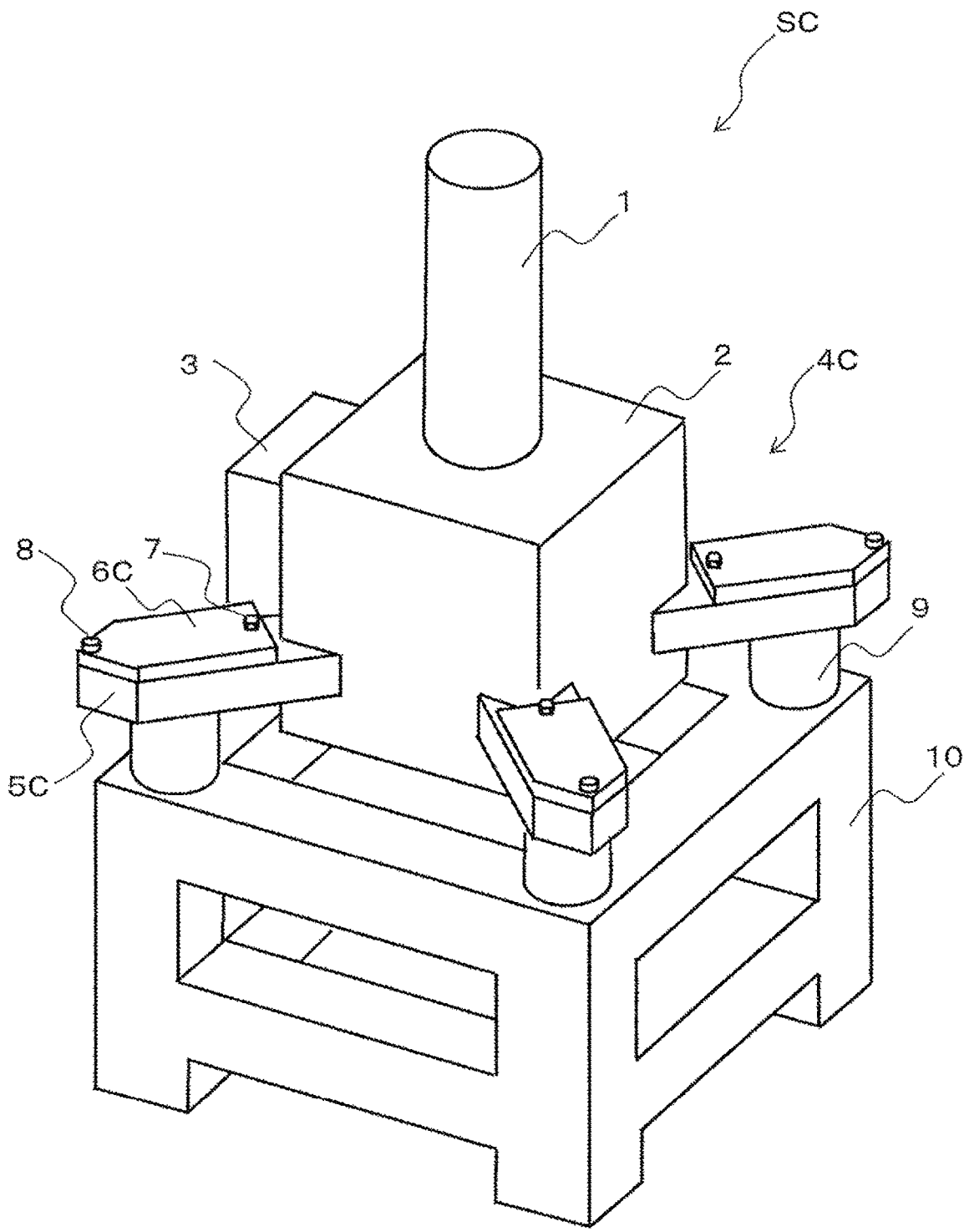

[FIG. 11]
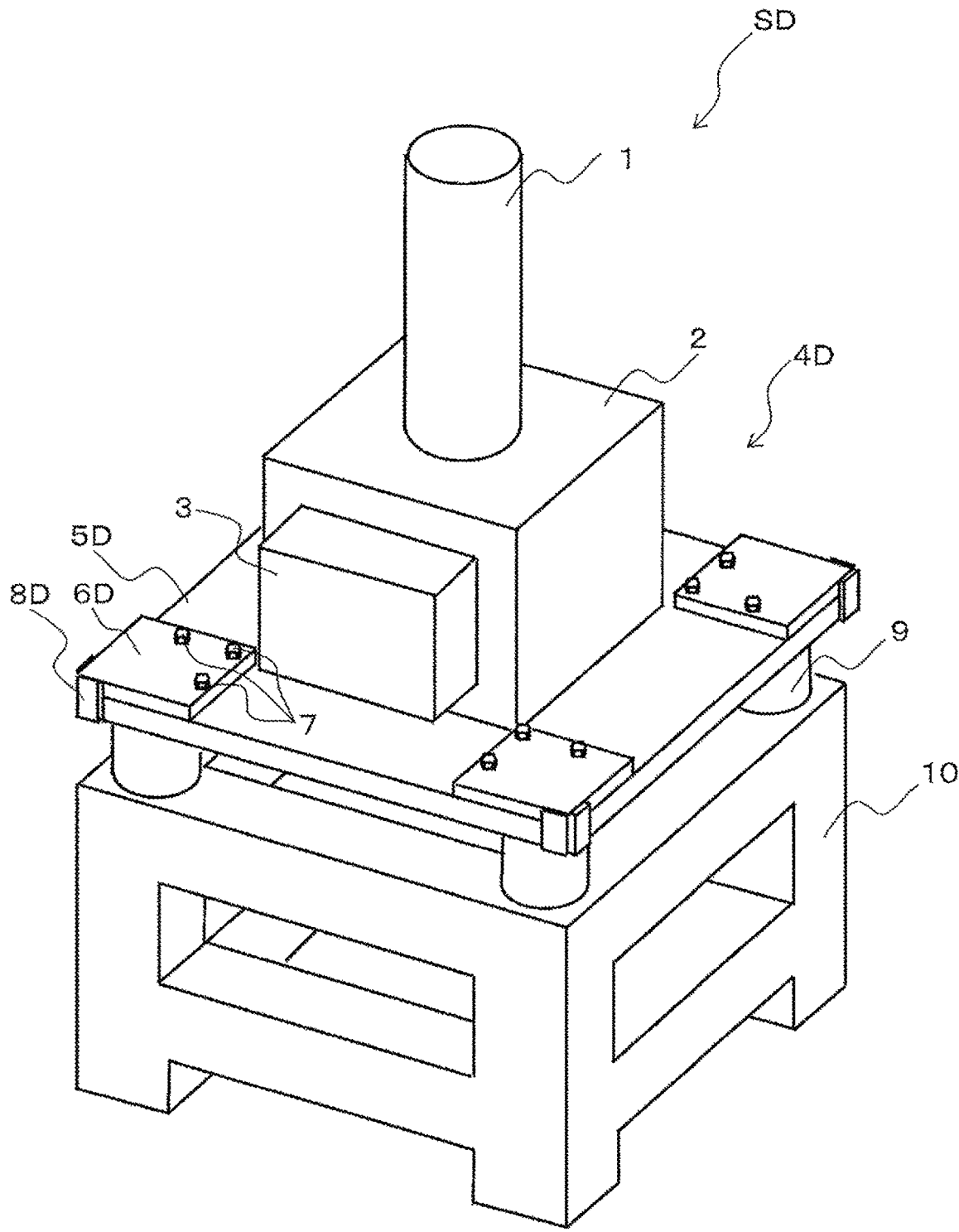

[FIG. 12]
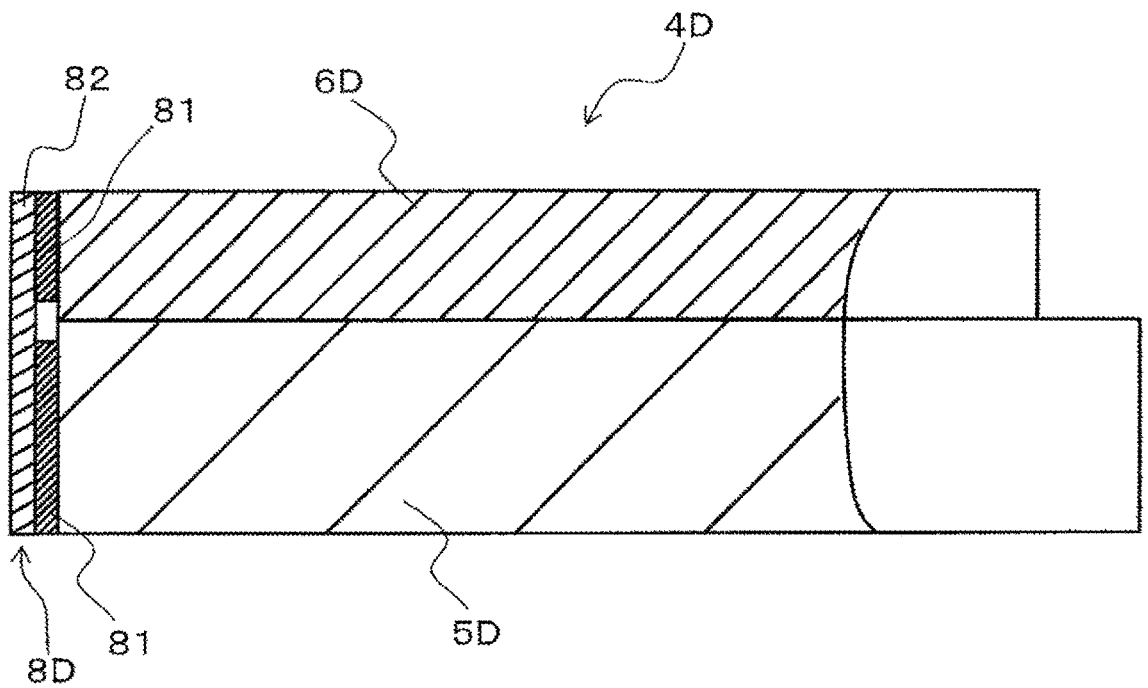
[FIG. 13]
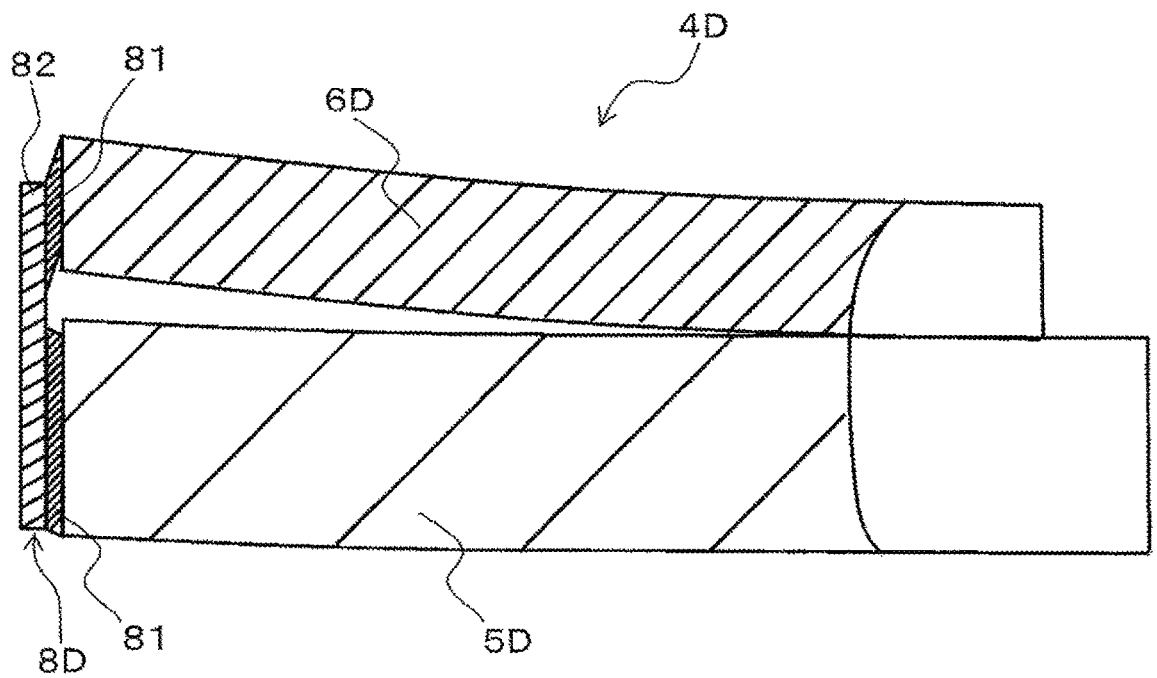

[FIG. 14]
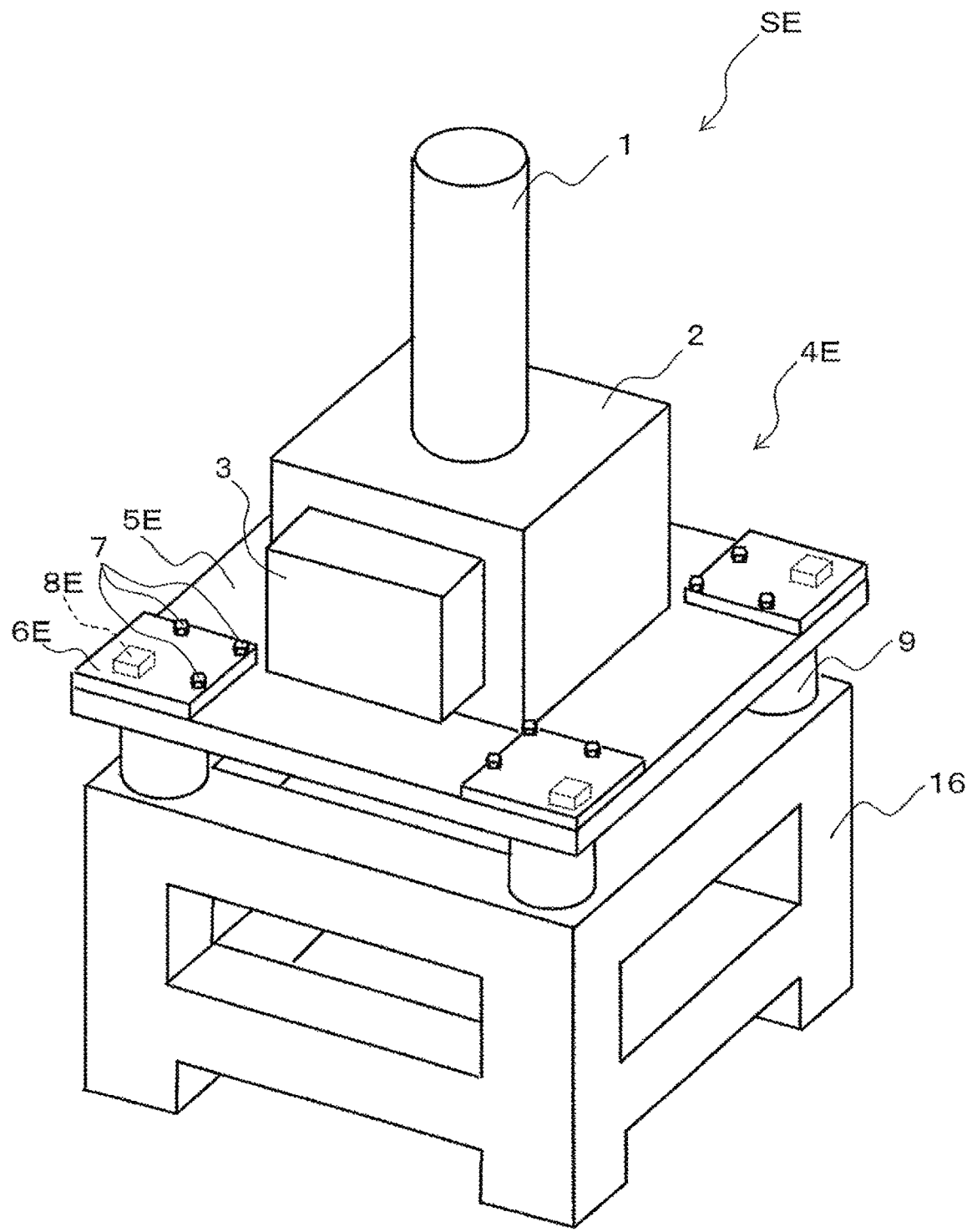

[FIG. 15]
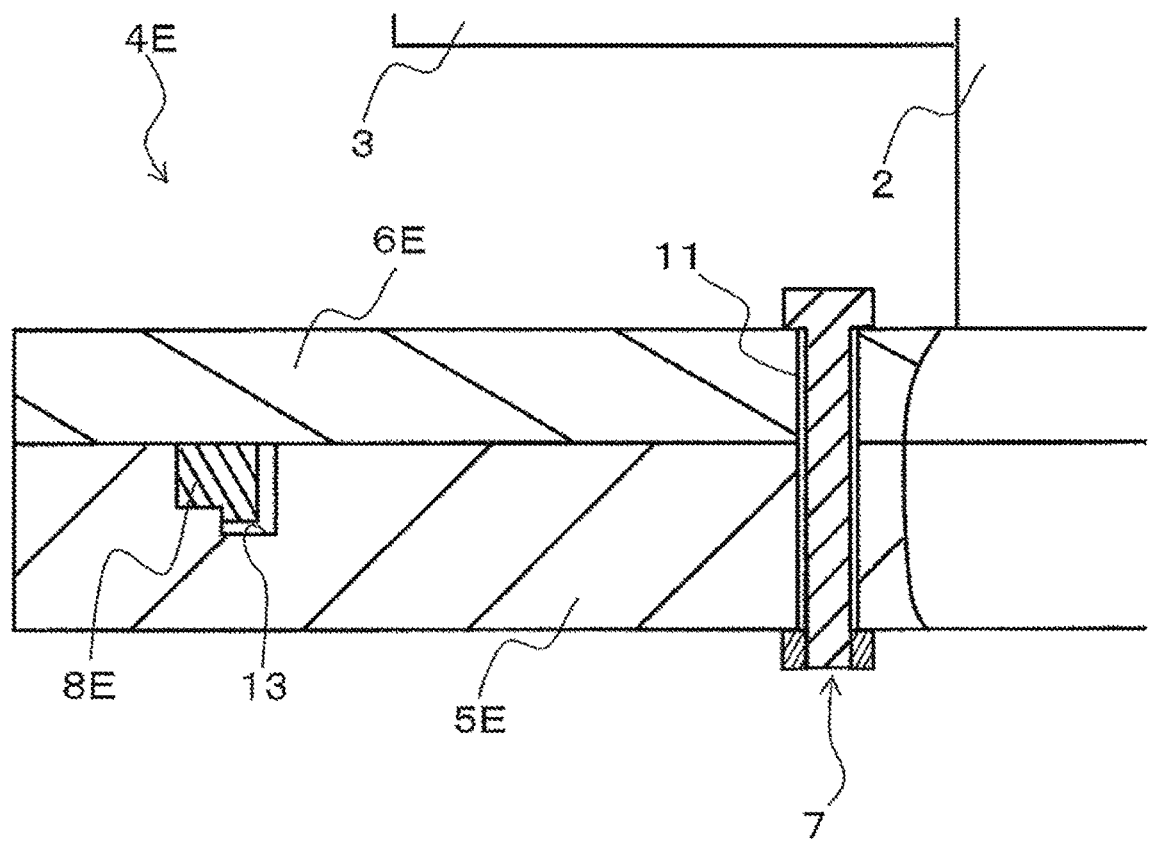

CHARGED PARTICLE BEAM DEVICE

TECHNICAL FIELD

The present invention relates to a charged particle beam device.

BACKGROUND ART

In a charged particle beam device, a column and a stage which include a sample chamber are supported by a rectangular plate called a base plate. Here, PTL 1 discloses a method by which vibration of the base plate is reduced. PTL 2 discloses a method by which vibration in other industrial machines is reduced.

CITATION LIST

Patent Literature

PTL 1: Japanese Patent No. 3741558
PTL 2: JP-A-2013-126072

SUMMARY OF INVENTION

Technical Problem

According to the above PTLs, vibration caused by a disturbance such as environmental sound cannot be reduced.

Accordingly, an object of the invention is to provide a charged particle beam device in which the vibration of a support body is reduced even under the action of the disturbance such as environmental sound.

Solution to Problem

In order to solve such a problem, the charged particle beam device according to the invention includes amounted object which includes: a column, a sample chamber, and a stage; a support body which supports the mounted object; and a vibration removing mount which supports the support body, wherein the support body includes: a first member which supports the mounted object, and is supported by the vibration removing mount; a second member which has a thickness different from that of the first member and is arranged to overlap the first member; a fixing member which fixes the first member and the second member; and a damping member which has rigidity lower than the fixing member and is deformed by a difference in variations between the first member and the second member.

Advantageous Effect

According to the invention, it is possible to provide a charged particle beam device in which vibration of a support body is reduced even under the action of the disturbance such as environmental sound.

BRIEF DESCRIPTION OF DRAWINGS

FIG. 1 is a perspective view of a charged particle beam device according to a first embodiment.

FIG. 2 is a top view of the charged particle beam device according to the first embodiment.

FIG. 3 is a schematic cross-sectional view of a support body included in the charged particle beam device according to the first embodiment.

FIGS. 4A and 4B are schematic views showing an eigenmode of a support member.

FIG. 5 is a schematic view showing the eigenmode of the support member on which reinforcing members are disposed.

FIG. 6 is a schematic view showing an arrangement of the support member, the reinforcing members, fixing members, and damping members in the support body.

FIG. 7 is a perspective view of a charged particle beam device according to a second embodiment.

FIG. 8 is a schematic view showing another eigenmode of the support member.

FIG. 9 is a perspective view of a charged particle beam device according to a third embodiment.

FIG. 10 is a perspective view of a charged particle beam device according to a modification of the third embodiment.

FIG. 11 is a perspective view of a charged particle beam device according to a fourth embodiment.

FIG. 12 is a schematic cross-sectional view showing a state of a support body, which is included in the charged particle beam device according to the fourth embodiment, before deformation.

FIG. 13 is a schematic cross-sectional view showing a state of the support body, which is included in the charged particle beam device according to the fourth embodiment, during deformation.

FIG. 14 is a perspective view of a charged particle beam device according to a fifth embodiment.

FIG. 15 is a schematic cross-sectional view of a support body included in the charged particle beam device according to the fifth embodiment.

DESCRIPTION OF EMBODIMENTS

Hereinafter, embodiments for implementing the invention (hereinafter referred to as "embodiments") will be described in detail with reference to the drawings as appropriate. In the drawings, common portions are denoted by the same reference numerals, and repeated description thereof is omitted.

First, the problem to be solved by the invention will be described. When a disturbance such as environmental sound acts on a support member (base plate) which supports a sample chamber of the charged particle beam device and is supported by a vibration removing mount, the support member vibrates. The vibration is transmitted to a stage or a column via the sample chamber, thus causing image shake.

In PTL 1, in order to reduce the vibration at four corners of a substantially rectangular flat plate called the base plate, damping members are disposed at the four corners of the base plate, and dynamic vibration absorbers carrying anti-vibration weights are disposed thereon. However, since the dynamic vibration absorber can only reduce the vibration in a target eigenmode, vibration in all eigenmodes cannot be reduced when a plurality of eigenmodes are excited. Further, in order to exert a reduction effect on vibration of the dynamic vibration absorber, it is necessary to adjust mass, rigidity and damping of the dynamic vibration absorber to optimal values, but it is difficult to accurately predict the rigidity and damping of the damping members, and therefore it is difficult to optimally adjust the parameters.

In PTL 2, a damping member having low rigidity is disposed between an attachment portion and a support portion to perform vibration removal support so as to reduce the vibration from the attachment portion to the support portion. However, when the disturbance such as environmental sound acts directly on the support portion, the support portion generates vibration of bending deformation or torsional deformation. When the damping member is not disposed at an antinode position in the eigenmode, the vibration cannot be reduced. In addition, in the charged particle beam device requiring a high degree of parallelism, if a support structure is configured such that the support portion and the attachment portion is sandwiched by a damping member having low rigidity, when a center of rigidity of the damping member and a center of mass of amounted object above the sample chamber are not on the same vertical line, the mounted object is inclined and the degree of parallelism cannot be maintained. Further, in the charged particle beam device having large mass, in order to support the device, it is necessary to increase a plate thickness of the support portion and the attachment portion. In the support structure in which the support portion and the attachment portion are sandwiched by the damping member having low rigidity, in order to make the rigidity of each portion not affect each other, it is necessary for each portion to have necessary rigidity, that is, plate thickness to support the device. Therefore, the weight of the support structure increases.

Therefore, in the following embodiments, it will describe a charged particle beam device in which a support body is rigid enough to support a sample chamber while the vibration of the support body is reduced even under the action of a disturbance such as environmental sound, the degree of parallelism of the support body is maintained, and increase in weight of the support body is suppressed.

First Embodiment

Charged Particle Beam Device S

A charged particle beam device S according to a first embodiment will be described with reference to FIG. 1. FIG. 1 is a perspective view of the charged particle beam device S according to the first embodiment.

The charged particle beam device S according to the first embodiment is a Scanning Electron Microscope (SEM), and includes a column 1 which outputs an electron beam, a sample chamber 2 which vacuum-seals a sample (not shown), a stage 3 which moves the sample to a desired position so that the sample can be observed from various angles, a support body 4 which supports the column 1 and the stage 3 from the sample chamber 2, a vibration removing mount 9 which supports the support body 4, and a base frame 10 which supports the vibration removing mount 9 from a lower side thereof.

Further, the support body 4 includes a support member (first member, load plate) 5 which supports the sample chamber 2, reinforcing members (second member, damping plate) 6 which reinforce the support member 5, fixing members 7 which fix the support member 5 and the reinforcing members 6, and damping members 8 which couple the support member 5 and the reinforcing members 6. That is, the support member 5 and the reinforcing members 6 are fixed by the fixing members 7 which have rigidity, and are coupled by the damping member 8 which damps vibration energy of the support member 5. Details of the support body 4 will be described later with reference to FIG. 2 or the like.

The column 1 is disposed on an upper portion or a side surface of the sample chamber 2 (FIG. 1 shows an example in which the column 1 is disposed on the upper portion of the sample chamber 2). The stage 3 is disposed on a side surface of the sample chamber 2. The support member 5 of the support body 4 is disposed to be capable of supporting the sample chamber 2 from a bottom surface or a side surface thereof (FIG. 1 shows an example in which the sample chamber 2 is supported from the bottom surface thereof by an upper surface of the support member 5). Further, the vibration removing mount 9 supports the support body 4 from a lower surface of the support member 5.

The constituent elements of the charged particle beam device S according to the first embodiment are not limited the above, and other constituent elements may be included. The support member 5 of the charged particle beam device S according to the first embodiment has a rectangular plate structure, but the structure is not limited thereto, and may be, for example, a polygonal plate structure. The support member 5 is not limited to the plate structure, and may be, for example, a beam structure (see a third embodiment to be described later) or may be other structures as long as the sample chamber 2 can be supported.

Support Body 4

Next, the support body 4 included in the charged particle beam device S according to the first embodiment will be further described with reference to FIGS. 2 and 3. FIG. 2 is a top view of the charged particle beam device S according to the first embodiment. FIG. 3 is a schematic cross-sectional view of the support body 4 included in the charged particle beam device S according to the first embodiment. The schematic cross-sectional view shown in FIG. 3 is a schematic cross-sectional view in which the support body 4 is cut to pass through the support member 5 and the reinforcing member 6.

The support member 5 is a base plate which supports the sample chamber 2 (mounted object including the column 1 disposed on an upper surface or the side surface of the sample chamber 2 and the stage 3), and has the rectangular plate structure in the example of FIG. 1. The support member 5 supports the sample chamber 2 which is a mounted object at substantially a center on an upper surface side of the support member 5. Further, the support member 5 is supported on the base frame 10 via the vibration removing mount 9 on a lower surface side of the support member.

The reinforcing member 6 is disposed on the upper surface side of the support member 5 such that the support member 5 and the reinforcing member 6 overlap. Further, the plate thickness of the reinforcing member 6 is different from the plate thickness of the support member 5. For example, the plate thickness of the reinforcing member 6 may be about ⅓ or more and ⅔ or less of the plate thickness of the support member 5.

The plate thickness of the support member 5 is not limited as long as the support member 5 is rigid enough to support the sample chamber 2, and is about 20 mm or more and 50 mm or less. The material of the support member 5 and the reinforcing member 6 is not limited to steel and may also be a material having high damping performance such as a metal material such as Ferrum Casting (FC) or Ferrum Casting Ductile (FCD), a ceramic, or a composite material of ceramic and metal material. Therefore, since the damping performance of the member improves, the reduction effect on vibration of the support body 4 is further enhanced.

The support member 5 and the reinforcing members 6 are provided with fixing holes 11 and coupling holes 12, which are through holes penetrating the support member 5 and the reinforcing members 6 (see FIG. 3). A position of the hole of the reinforcing member 6 is provided at a position where a center axis of the hole of the reinforcing member 6 is coaxial with the center axis of the hole of the support member 5 when the reinforcing member 6 is disposed on the support member 5.

The fixing member 7 has rigidity higher than the damping member 8, and is a member which fixes the support member 5 and the reinforcing member 6 such that the members are not separated from each other even when the support member 5 vibrates. The fixing member 7 is configured by, for example, a metal bolt 7a and a nut 7b, and is arranged in the fixing hole 11 (see FIG. 3) which penetrates the support member 5 and the reinforcing member 6 to fix the support member 5 and the reinforcing member 6. In addition, in FIGS. 1 and 2, in order to distinguish the damping member 8, the fixing member 7 is illustrated as a hexagonal bolt having a bolt head portion whose outer shape is a hexagonal column shape, but it is not limited thereto.

The fixing member 7 is described as one using the bolt 7a and the nut 7b, but it is not limited thereto. The fixing member 7 may fix the support member 5 and the reinforcing member 6 by welding, riveting, or bonding by a pin. In addition, the fixing hole 11 is described as a through hole which penetrates the support member 5 and the reinforcing member 6, but it is not limited thereto. The fixing hole in one of the support member 5 and the reinforcing member 6 may be a screw hole, and the bolt 7a which is the fixing member 7 may be screwed in the fixing hole to fix the members.

The damping member 8 has rigidity lower than that of the fixing member 7 (for example, rigidity of $1/10$ or less of the rigidity of the fixing member 7), and is a member which damps the vibration energy of the support member 5 by friction or viscoelasticity of the material of the member. That is, when the support member 5 vibrates, and a relative variation between the support member 5 and the reinforcing member 6 occurs at a position of the damping member 8, the damping member 8 is deformed. When the damping member 8 is deformed, the vibration energy of the support member 5 is dissipated, and the vibration of the support member 5 is reduced. The damping member 8 is configured by, for example, a bolt 8a and a nut 8b made of resin, rubber, or the like, and is arranged in the coupling hole 12 (see FIG. 3) which penetrates the support member 5 and the reinforcing member 6 to couple the support member 5 and the reinforcing member 6. In addition, in FIGS. 1 and 2, in order to distinguish the fixing member 7, the damping member 8 is illustrated as a bolt with a hole which includes a bolt head portion whose outer shape is a cylindrical shape (however, a hole on the head portion is omitted), but it is not limited thereto.

The damping member 8 is described as one using the bolt 8a and the nut 8b, but it is not limited thereto. In addition, the coupling hole 12 is described as a through hole which penetrates the support member 5 and the reinforcing member 6, but it is not limited thereto. The coupling hole in one of the support member 5 and the reinforcing member 6 may be a screw hole, and the bolt 8a which is the damping member 8 may be screwed in the coupling hole to couple the members.

Further, in addition to rubber, resin, or the like, the damping member 8 may be made of a material having high damping and a Young's modulus of $1/10$ or less as compared with the material of the support member 5 and the reinforcing member 6. The structure of the damping member 8 is not limited to a bolt and nut structure made of rubber, resin or the like which are materials having high damping, and may be any structure as long as the structure can be damped by friction or the like and the structure has rigidity of $1/10$ or less of the rigidity of the support member 5 and the reinforcing member 6. For example, the structure may be one in which a pin is inserted into the coupling hole 12 of the support member 5 and the reinforcing member 6. Further, if the structure of the damping member 8 has high damping and the rigidity can be set to $1/10$ or less of the rigidity of the support member 5 or the reinforcing member 6, the material of the damping member 8 does not need to have the Young's modulus of $1/10$ or less of the material of the support member 5 or the reinforcing member 6, and may be, for example, a metal material having high damping performance such as a magnesium alloy.

Here, the eigenmode of the support member 5 having the rectangular plate structure will be described with reference to FIGS. 4A and 4B. FIGS. 4A and 4B are schematic views showing an eigenmode of the support member 5, wherein FIG. 4A is an example of a mode in which adjacent corner portions of the four corners of the plate vibrate in opposite phases, and FIG. 4B is an example of a mode in which the corner portions of the four corners of the plate vibrate in the same phase. In FIGS. 4A and 4B (the same applies to FIGS. 5 and 8 to be described later), an outer shape of the support member 5 before vibration is indicated by a thin solid line, and a shape of the support member 5 in each eigenmode is illustrated to be emphasized and larger than actual amplitude. In addition, magnitude of the amplitude is indicated by shading of dot hatching, and the hatching is applied such that the larger the amplitude in a region is, the sparse the dots are, and the smaller the amplitude in a region, the dense the dots are.

Node positions in the eigenmode are mainly in the vicinity of the sample chamber 2 (in FIGS. 4A and 4B, a region where the sample chamber 2 is disposed is indicated by a dashed line 20). Since the support member 5 is fixed to the sample chamber 2, the node positions in the eigenmodes are substantially in the vicinity of the sample chamber 2 even when the support member 5 has a shape other than the rectangular plate structure.

The antinode positions of the eigenmode are indicated by arrows 21 in FIGS. 4A and 4B. The positions are mainly at the four corners of the support member 5.

Therefore, as shown in FIGS. 1 and 2, the positions where the fixing members 7 fix the support member 5 and the reinforcing members 6 (the positions where the fixing holes 11 are provided) can be, for example, in the vicinity of the node positions of the support member 5 in the eigenmode. Further, as shown in FIGS. 1 and 2, the positions where the damping members 8 couple the support member 5 and the reinforcing members 6 (the positions where the coupling holes 12 are provided) can be, for example, in the vicinity of the antinode positions of the support member 5 in the eigenmode.

Next, the eigenmode of the support body 4 in which the reinforcing members 6 are disposed on the support member 5 will be described with reference to FIG. 5. FIG. 5 is a schematic view showing the eigenmode of the support member 5 on which the reinforcing members 6 are disposed. FIG. 5 shows an example of a mode in which adjacent corner portions of the four corners of the plate vibrate in opposite phases (see the mode shown in FIG. 4A).

When the disturbance such as environmental sound acts on the support member 5 and the eigenmode of the support member 5 is excited, as shown in FIG. 5, relative displacement between the support member 5 and the reinforcing member 6 occurs at the antinode position of the support member 5 in the eigenmode. Further, the damping member 8 is deformed at a position where the relative displacement occurs, the vibration energy of the support member 5 is dissipated, and the vibration of the support member 5 is reduced.

Here, since a bending mode of the plate of the support member 5 is generally a mode in which the four corners of the support member 5 are antinode positions, it is possible to reduce the vibration in a plurality of eigenmodes if the support body 4 included in the charged particle beam device S according to the first embodiment is configured as above.

Further, the support body 4 included in the charged particle beam device S according to the first embodiment has a structure in which the support member 5 and the reinforcing members 6 are overlapped, fixed by the fixing members 7, and coupled by the damping members 8, and the vibration of the support member 5 can be reduced without adjusting the rigidity and the damping as in the dynamic vibration absorber disclosed in PTL 1.

When the rigidity of the reinforcing member 6 is too small with respect to the plate thickness of the support member 5, the difference in rigidity is too large, the deformation of the reinforcing member 6 follows the deformation of the support member 5, and the relative displacement is less likely to occur therebetween. Therefore, if the support member 5 and the reinforcing member 6 are made of the same material, the plate thickness of the reinforcing member 6 is about ⅓ to ⅔ of the plate thickness of the support member 5. Further, since the support body 4 included in the charged particle beam device S according to the first embodiment supports the mounted object on the sample chamber 2 only by the support member 5, it is not necessary for the reinforcing member 6 to be rigid enough to support the mounted object on the sample chamber 2.

In addition, since the support member 5 has high rigidity, and is hardly deformed even when the mounted object on the sample chamber 2 having weight is disposed, the degree of parallelism can be maintained.

With the above configuration, even when the disturbance such as environmental sound acts on various portions of the support member 5, it is possible to easily reduce the vibration in a plurality of eigenmodes, and further, the degree of parallelism and the rigidity of the support member 5 can be maintained.

Here, a parameter survey was performed under the condition shown in FIG. 6. FIG. 6 is a schematic view showing an arrangement of the support member 5, the reinforcing members 6, the fixing members 7, and the damping members 8 in the support body 4. The arrangement of the fixing members 7 and the damping members 8 is only shown at a portion corresponding to the reinforcing member 6 at an upper right side of the drawing, the portions corresponding to the other reinforcing members 6 are similar, and illustration thereof is omitted.

Here, a length of one side of the square plate-shaped support member 5 was set to L5 (=1000 mm), a length of one side of the square plate-shaped reinforcing member 6 was set to L6 (=350 mm), a position of the fixing member 7 from an end of the support member 5 was set to L7, and a position of the damping member 8 from an end of the support member 5 was set to L8. A center of the support member 5 and the position of the fixing member 7 closest to the center of the support member 5 were set as evaluation points P, and the vibration of the support member 5 at evaluation points P was evaluated.

Regardless of how the fixing member 7 and the damping member 8 are arranged, when the support member 5 vibrates, relative displacement between the support member 5 and the reinforcing member 6 occurs at the position of the damping member 8, the damping member 8 is deformed and the vibration energy of the support member 5 is dissipated, so that the vibration of the support member 5 can be reduced.

In particular, the position L7 of the fixing member 7 from an end of the plate is set to a range of 1/7 or more and 1/6 or less of the length L5 of the support member 5, and the position L8 of the damping member 8 from an end of the plate is set to a range of 1/5 or more and 1/4 or less of the length L5 of the support member 5, so that the vibration of the support member 5 can be further reduced.

Second Embodiment

Next, a charged particle beam device SA according to a second embodiment will be described with reference to FIG. 7. FIG. 7 is a perspective view of the charged particle beam device SA according to the second embodiment.

The charged particle beam device SA according to the second embodiment is different from the charged particle beam device S according to the first embodiment in a configuration of a support body 4A. Specifically, positions where the reinforcing members 6 are disposed on the support member 5 are different. That is, in the charged particle beam device S according to the first embodiment, the reinforcing members 6 are disposed at the four corners of the support member 5, whereas in the charged particle beam device SA according to the second embodiment shown in FIG. 7, reinforcing members 6a are disposed at four corners of the support member 5, and reinforcing members 6b are further added to the vicinity of a center of each side of the support member 5. Other configurations are similar, and repeated description is omitted.

In the reinforcing member 6b which is disposed at the center of each side of the support member 5, the fixing member 7 is disposed in the vicinity of the sample chamber 2, and the damping member 8 is disposed in the vicinity of the center of each side of the support member 5.

FIG. 8 is a schematic view showing another eigenmode of the support member 5, and is an example of the eigenmode in which the vicinity of the sample chamber 2 (in FIG. 8, a region where the sample chamber 2 is disposed is indicated by the dashed line 20) is a node, and the center of each side of the support member 5 indicated by an arrow 22 is an antinode.

According to the charged particle beam device SA of the second embodiment, since the reinforcing member 6b is added to the vicinity of the center of each side of the support member 5, the vibration in the eigenmode shown in FIG. 8 can be damped. Further, since the reinforcing members 6a are arranged at the four corners of the support member 5 similarly to the charged particle beam device S according to the first embodiment, the vibration in the eigenmode shown in FIGS. 4A and 4B can be damped. That is, according to the charged particle beam device SA of the second embodiment, more vibration in the eigenmode than the charged particle beam device S according to the first embodiment can be damped.

Third Embodiment

Next, a charged particle beam device SB according to a third embodiment will be described with reference to FIG. 9. FIG. 9 is a perspective view of the charged particle beam device SB according to the third embodiment.

The charged particle beam device SB according to the third embodiment is different from the charged particle beam device S according to the first embodiment in a shape of a support member 5B of a support body 4B. In addition, in the charged particle beam device S according to the first embodiment, the support member 5 supports the sample chamber 2 from the bottom surface thereof, whereas in the charged particle beam device SB according to the third embodiment, the support member 5B is divided and the sample chamber 2 is supported from the side surface thereof. Other configurations are similar, and repeated description is omitted.

The support member 5B of the charged particle beam device SB according to the third embodiment may be provided with a notch 51 between two points supported by the vibration removing mount 9, which does not impair the support of the sample chamber 2. Thus, it is possible to suppress the vibration in the eigenmode in which the center of the support member 5B is the antinode position.

In the support body 4B of the charged particle beam device SB according to the third embodiment, the sample chamber 2 is supported by two support members 5B, but in a case of being supported at four points, the sample chamber 2 may be supported by four support members, and the size of the support member may be set only to a range in which the vibration removing mount 9 and the sample chamber 2 are linearly coupled.

In the support body 4B of the charged particle beam device SB according to the third embodiment, the support member 5B is described as a plate structure, but it is not limited thereto. FIG. 10 is a perspective view of a charged particle beam device SC according to a modification of the third embodiment. As shown in FIG. 10, a support member 5C of a support body 4C may have a beam structure.

The positions of the reinforcing members 6C, the fixing members 7, and the damping members 8 may be appropriately provided similarly to the first embodiment.

As described above, according to the charged particle beam devices SB, SC of the third embodiment, it is possible to reduce the size and weight of the support members 5B, 5C by disposing the support members 5B, 5C at necessary positions.

Fourth Embodiment

Next, a charged particle beam device SD according to a fourth embodiment will be described with reference to FIG. 11. FIG. 11 is a perspective view of the charged particle beam device SD according to the fourth embodiment.

The charged particle beam device SD according to the fourth embodiment is different from the charged particle beam device S according to the first embodiment in a structure of a damping member 8D of a support body 4D. Other configurations are similar, and repeated description is omitted.

In the charged particle beam device S according to the first embodiment, the damping member 8 is disposed inside the four corners of the support member 5 corresponding to the vicinity of the antinode positions of the plate of the support member 5 in the bending mode, whereas in the charged particle beam device SD according to the fourth embodiment, the damping member 8D is disposed on a side surface in the vicinity of the antinode position of a support member 5D and a reinforcing member 6D.

FIG. 12 is a schematic cross-sectional view showing a state of the support body 4D, which is included in the charged particle beam device SD according to the fourth embodiment, before deformation. FIG. 13 is a schematic cross-sectional view showing a state of the support body 4D, which is included in the charged particle beam device SD according to the fourth embodiment, during deformation.

As shown in FIG. 12, the damping member 8D is configured by damping portions 81 made of a damping material such as rubber, and a support portion 82 made of resin having rigidity higher than rubber, or a metal material. The damping portions 81 of the damping member 8 are disposed on side surfaces of the support member 5D and the reinforcing member 6D respectively, and the two damping portions 81 are coupled by the support portion 82. It is illustrated that one damping portion 81 is disposed on each of the support member 5 and the reinforcing member 6, but the number is not limited thereto. Further, the size of the damping portion 81 may be increased according to the size of the support member 5 and the reinforcing member 6.

As shown in FIG. 13, when the support member 5D and the reinforcing member 6D are deformed, the damping portions 81 made of the damping material undergoes shear deformation, and the vibration energy is dissipated.

According to the charged particle beam device SD of the fourth embodiment, since the damping part (damping portions 81) of the damping member 8D can be enlarged, a suppression effect on vibration in the bending mode can be enhanced as compared with the damping member 8 (the bolt 8a and the nut 8b) of the charged particle beam device S according to the first embodiment.

Fifth Embodiment

Next, a charged particle beam device SE according to a fifth embodiment will be described with reference to FIG. 14. FIG. 14 is a perspective view of the charged particle beam device SE according to the fifth embodiment.

The charged particle beam device SE according to the fifth embodiment is different from the charged particle beam device S according to the first embodiment in a structure of a damping member 8E of a support body 4E. Other configurations are similar, and repeated description is omitted.

FIG. 15 is a schematic cross-sectional view of the support body 4E included in the charged particle beam device SE according to the fifth embodiment.

A support member 5E is provided with stepped grooves 13 in which damping members 8E are disposed, and the damping member 8E is compressed from upper and lower sides by the support member 5E and the reinforcing member 6E and sandwiched therebetween. The structure of the stepped groove 13 may have any shape as long as the structure is large enough to house the damping member 8E therein. Although the stepped groove 13 is provided on a side portion of the support member 5E, the stepped groove 13 may be provided on a side portion of the reinforcing member 6E.

Even if the damping member 8 is compressed and deformed by the reinforcing member 6, the stepped groove 13 is an escaping place of deformation of the damping member 8. Even if a relative displacement between the support member 5 and the reinforcing member 6 occurs, since a part of the damping member 8 which is escaped into the stepped groove 13 returns to an original state, the support member 5 and the reinforcing member 6 remain coupled by the damping member 8.

With the configuration described above, according to the charged particle beam device SE of the fifth embodiment, a shape of the damping member 8E can be arranged in accordance with a deformed shape in the eigenmode, and a size of the damping member 8E can be arbitrarily set, so that the suppression effect on vibration in the bending mode can be enhanced as compared with the damping member 8 of the charged particle beam device S according to the first embodiment.

Modification

The charged particle beam devices S to SE according to the present embodiment (first to fifth embodiments) are not limited to the configurations of the above embodiments, and various modifications can be made without departing from the scope of the invention.

The charged particle beam devices S to SE according to the embodiments are described as an SEM, but it is not limited thereto. For example, the device may be a Focused Ion Beam System (FIB) or a Transmission Electron Microscope (TEM).

REFERENCE SIGN LIST 1 column
2 sample chamber
3 stage
4 support body
5 support member (first member)
6 reinforcing member (second member)
7 fixing member
8 damping member
9 vibration removing mount
10 base frame
11 fixing hole
12 coupling hole
13 stepped groove

The invention claimed is:

1. A charged particle beam device, comprising:
a mounted object which includes a column, a sample chamber, and a stage;
a support body which supports the mounted object; and
a vibration removing mount which supports the support body,
wherein the support body includes:
a load plate which supports the mounted object, and is supported by the vibration removing mount;
a damping plate which has a thickness different from that of the load plate and is arranged to overlap the load plate;
a fixing structure which fixes the load plate and the damping plate; and
a damping structure which has rigidity lower than the fixing structure and is deformed by a difference in variation between the load plate and the damping plate;
wherein the fixing structure is arranged at a position corresponding to a node position of the load plate in an eigenmode, and
wherein the damping structure is arranged at a position corresponding to an antinode position of the load plate in the eigenmode.

2. The charged particle beam device according to claim 1, wherein the fixing structure is arranged at a position corresponding to a node position of a plate of the load plate in a bending mode, and
wherein the damping structure is arranged at a position corresponding to an antinode position of the plate of the load plate in the bending mode.

3. The charged particle beam device according to claim 2, wherein the load plate has a rectangular plate shape,
wherein the fixing structure is arranged at a position corresponding to a node position of the plate of the load plate in which four corners thereof vibrate in the bending mode, and
wherein the damping structure is arranged at a position corresponding to an antinode position of the plate of the load plate in which the four corners vibrate in the bending mode.

4. The charged particle beam device according to claim 1, wherein the load plate has a square plate shape,
wherein the fixing structure is arranged in a range of $1/7$ or more and $1/6$ or less of a length of a side of the load plate from an end of the load plate, and
wherein the damping structure is arranged in a range of $1/5$ or more and $1/4$ or less of a length of a side of the load plate from an end of the load plate.

5. The charged particle beam device according to claim 1, wherein the load plate is a plate structure in which a plate thickness is 20 mm or more and 50 mm or less, and
wherein the damping plate is a plate structure in which a plate thickness is $1/3$ or more and $2/3$ or less of the plate thickness of the load plate.

6. The charged particle beam device according to claim 1, wherein the load plate is divided into a plurality of portions.

7. The charged particle beam device according to claim 1, wherein the damping structure is arranged on outer peripheral side surfaces of the load plate and the damping plate.

8. The charged particle beam device according to claim 1, wherein the damping structure is arranged in a stepped groove provided in the load plate or the damping plate.

* * * * *